(12) United States Patent
Byeon

(10) Patent No.: US 9,734,875 B2
(45) Date of Patent: Aug. 15, 2017

(54) SEMICONDUCTOR MEMORY APPARATUS

(71) Applicant: SK hynix Inc., Icheon-si Gyeonggi-do (KR)

(72) Inventor: Sang Jin Byeon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 186 days.

(21) Appl. No.: 14/518,650

(22) Filed: Oct. 20, 2014

(65) Prior Publication Data

US 2016/0012866 A1 Jan. 14, 2016

(30) Foreign Application Priority Data

Jul. 10, 2014 (KR) .................. 10-2014-0086797

(51) Int. Cl.
| | |
|---|---|
| G11C 5/14 | (2006.01) |
| G11C 29/02 | (2006.01) |
| G11C 5/02 | (2006.01) |
| G11C 8/12 | (2006.01) |
| G11C 29/04 | (2006.01) |
| G11C 29/44 | (2006.01) |

(52) U.S. Cl.
CPC ............ *G11C 5/147* (2013.01); *G11C 5/148* (2013.01); *G11C 29/021* (2013.01); *G11C 29/028* (2013.01); *G11C 5/025* (2013.01); *G11C 8/12* (2013.01); *G11C 2029/0411* (2013.01); *G11C 2029/4402* (2013.01)

(58) Field of Classification Search
CPC ..................................................... G11C 5/147
USPC ........................................ 365/227, 195, 200
See application file for complete search history.

(56) References Cited

U.S. PATENT DOCUMENTS

| | | | |
|---|---|---|---|
| 2007/0076467 A1* | 4/2007 | Yamaoka ............. | G11C 11/412 365/154 |
| 2008/0151673 A1* | 6/2008 | Fallah .................. | G11C 11/417 365/226 |
| 2009/0046523 A1* | 2/2009 | Maki ..................... | G11C 29/83 365/200 |

FOREIGN PATENT DOCUMENTS

| | | |
|---|---|---|
| KR | 1019990071429 A | 9/1999 |
| KR | 1020020075195 A | 10/2002 |

\* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor memory apparatus includes an effective region which is a portion of the memory region and functions as a data storage space, a residual region which is another portion of the memory region, and a capacity control circuit which restricts supply of power and signals to the residual region.

15 Claims, 16 Drawing Sheets

140-2

140-3

SEMICONDUCTOR MEMORY APPARATUS

CROSS-REFERENCES TO RELATED APPLICATION

This application claims priority under 35 U.S.C. 119(a) to Korean application No. 10-2014-0086797 filed on Jul. 10, 2014, in the Korean Intellectual Property Office, which is incorporated by reference in its entirety.

BACKGROUND

1. Technical Field

Various embodiments generally relate to a semiconductor integrated circuit, and more particularly, in one or more embodiments, to a semiconductor memory apparatus.

2. Related Art

When accessing a memory device, it is necessary for a memory controller to efficiently access wherever in the memory device. A memory controller can locate where a specific memory cell is by using X-address and Y-address. A total number of addresses of a memory device may be determined based on X-address bits and Y-address bits. Where a memory device has N bits for X-address bits and M bits for Y-address bits, the total number of addresses of the memory device may be 2(N+M). For example, where a memory device has 10 bits for X-address bits and 10 bits for Y-address bits, the total number of addresses of the memory device may be 220. The data capacity of the memory device may be determined according to the total number of addresses of the memory device. Therefore, random access memory ("RAM") sizes are usually in powers of 2.

Unlike general RAM devices, some memory devices may have data capacities which are not in powers of 2 (e.g., 3 GB or 6 GB) to meet various system requirements.

SUMMARY

According to an embodiment, there is provided a semiconductor memory apparatus. The semiconductor memory apparatus may include an effective region configured to form a portion of an memory region and function as a data storage space; a residual region configured to form another portion of the memory region; and a capacity control circuit configured to restrict supply of power and signals to the residual region.

According to an embodiment, there is provided a semiconductor memory apparatus. The semiconductor memory apparatus may include an effective region configured to form a portion of an memory region and function as a data storage space, a residual region configured to form another portion of the memory region, and a bias supply unit configured to control voltages being applied to power terminals of a plurality of switching circuits formed in the residual region.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
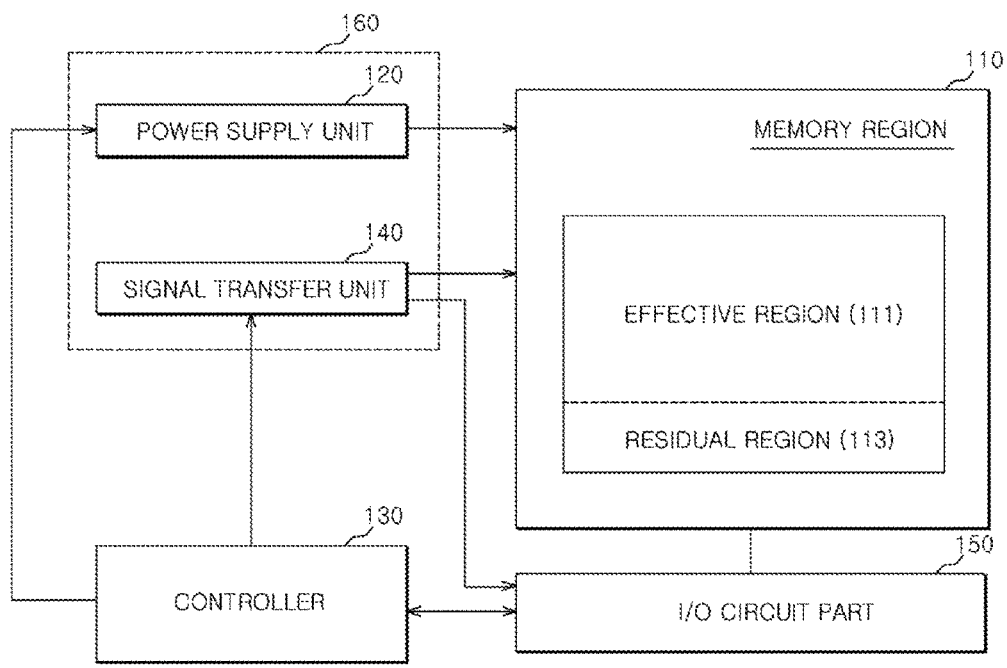
FIG. 1 is a schematic view illustrating a configuration of a semiconductor memory apparatus according to an embodiment.

Exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the another layer or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

As illustrated in FIG. 1, a semiconductor memory apparatus 10 according to an embodiment may include a memory region 110, a capacity control circuit 160, a controller 130, and an input/output (I/O) circuit part 150. The capacity control circuit 160 may include a power supply unit 120, and a signal transfer unit 140. In an embodiment, the semiconductor memory apparatus 10 may be an electronic system having one or more of semiconductor memory chips therein.

The memory region 110 may include an effective region 111 and a residual region 113. Further, although not shown in FIG. 1, the memory region 110 may include functional units which are necessary to write and read data. For example, the memory region 110 may include a decoding circuit for decoding command signals and an amplification circuit for amplifying data signals.

In an embodiment, the effective region 111 may serve as a data storage space. In an embodiment, the residual region 113 may be at least a portion of the memory region 110 other than the effective region 111.

Where a memory device has N bits for X-address bits and M bits for Y-address bits, the memory region 110 may have data capacity of a power of 2 (i.e., $2^{(N+M)}$). A portion of the memory region 110 may be set to the effective region 111 which is actually used to store data, and a remaining portion of the memory region 110 other than the effective region 111 may be set to the residual region 113. A size of the effective region 111 may vary according to the type of electronic system which uses the memory region 110.

The residual region 113 may be left as an unused region, or at least a portion of the residual region 113 may be converted into a circuit part for other purpose by controlling power and/or signal being provided thereto. The circuit part for the other purpose may include at least one of a reservoir capacitor region, an error correction code (ECC) region, and a redundancy region.

The capacity control circuit 160 may control the power supply and the signals provided to the effective region 111 and the residual region 113. The capacity control circuit 160 may include a power supply unit 120 and a signal transfer unit 140.

The power supply unit 120 receives an external voltage and transfers the external voltage to the inside of the semiconductor memory apparatus 10.

In an embodiment, the memory region 110 may be divided into a plurality of zones. The zone means a unit region into which the memory region 110 is physically divided. Therefore, it should be noted that the zone, into which the memory region 110 is physically divided, has a meaning different from the effective region 111 and the residual region 113 into which the memory region 110 is divided in terms of function.

The power supply unit 120 may supply the necessary voltages to the plurality of zones in the memory region 110. In an embodiment, the power supply unit 120 may minimize the power supply with respect to the zone in which the residual region 113 is included. For example, the power supply unit 120 may not supply the necessary voltages to a zone in which the residual region 113 is included. Thus, the power supply unit 120 may be controlled by a preset mode control signal (e.g., mode resister set ("MRS") signal) provided from the controller 130 or by fuse programming.

The controller 130 may control an overall operation of the semiconductor memory apparatus 10. For example, the controller 130 may provide the MRS signal to the power supply unit 120. Further, the controller 130 may provide the necessary signals such as an address signal, a command signal, and a clock signal to the signal transfer unit 140. For example, the address signal, the command signal, and the clock signal may be provided from an external apparatus such as a host device. The controller 130 may receive data from the external apparatus and provide the data to the I/O circuit part 150. Also, the controller 130 may receive data from the I/O circuit part 150 and provide the data to the external apparatus.

The signal transfer unit 140 may receive signals (e.g., address signal, command signal, and clock signal) provided from the controller 130 and provide the signals to the memory region 110. In an embodiment, the signal transfer unit 140 may provide only a minimum number of signals to the residual signal 113. For example, the signal transfer unit 140 may restrict the supply of the signals with respect to a zone defined as the residual region 113. Thus, the signal transfer unit 140 may be controlled by the preset mode control signal (e.g., MRS signal) provided from the controller 130 or by fuse programming.

The I/O circuit part 150 may amplify input data signals provided from the controller 130 and provide the input data to the memory region 110. Also, the I/O circuit part 150 may amplify data output from the memory region 110 and provide the data to the controller 130.

The semiconductor memory apparatus 10 may include the memory region 110. The memory region 110 may include the effective region 111 and the residual region 113. In an embodiment, the memory region 110 may have data capacity of a power of 2. For example, provided that memory region 110 has N bits for X-address bits and M bits for Y-address bits, the memory region 110 may have data capacity of $2^{(N+M)}$. In an embodiment, only a portion of the memory region 110 may be used as the effective region 111 which may serve as a data storage space, and the residual region 113 may not be used as a data storage space. For example, the residual region 113 may be used for other purposes.

Figure 2:
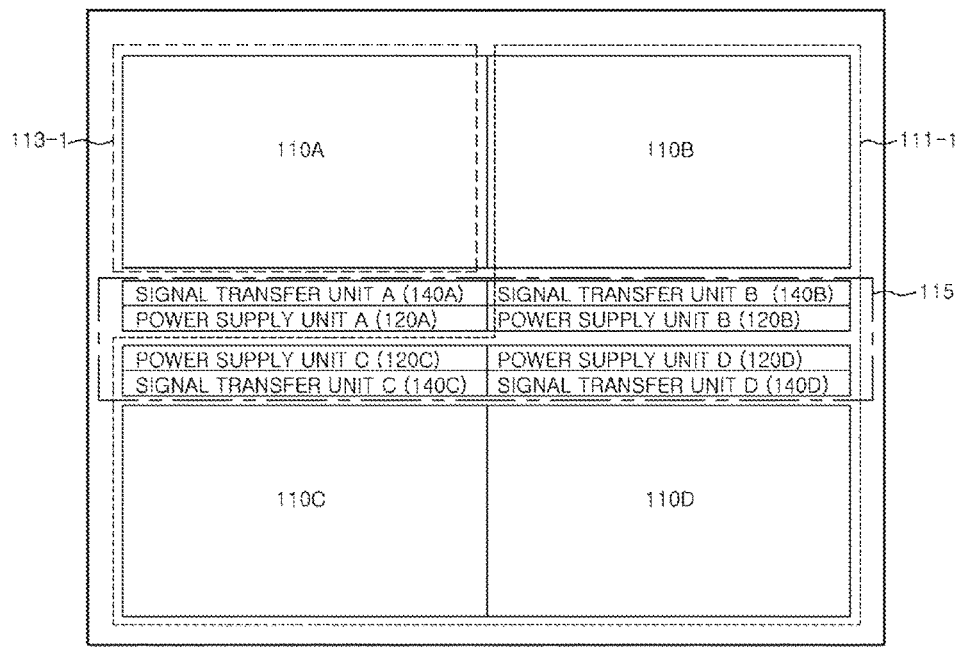
FIGS. 2 to 4 schematic views illustrating configurations of memory regions according to an embodiment.
Figure 3:
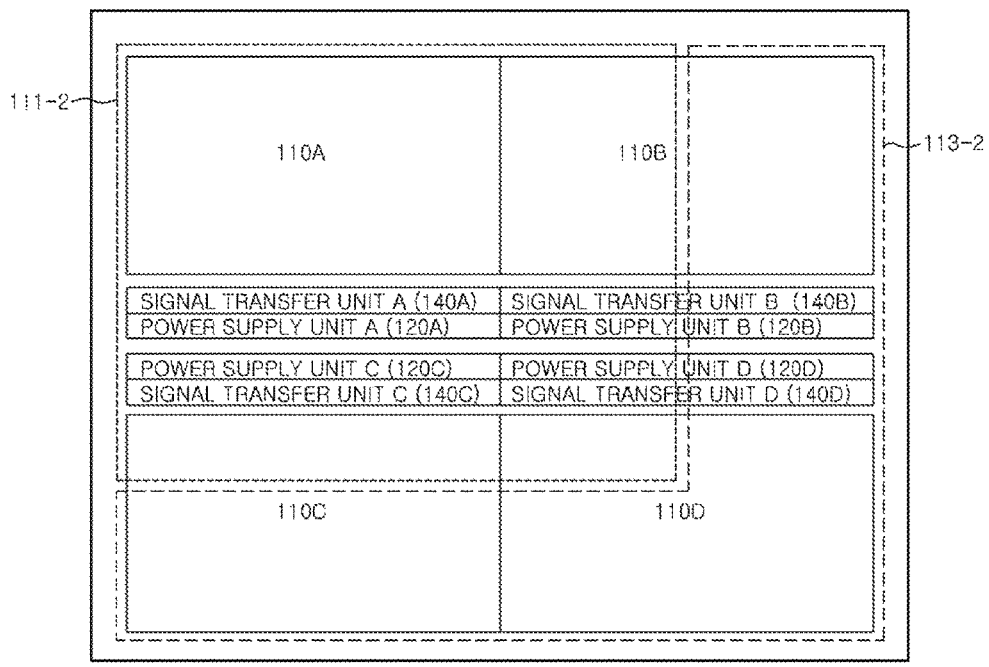
Figure 4:
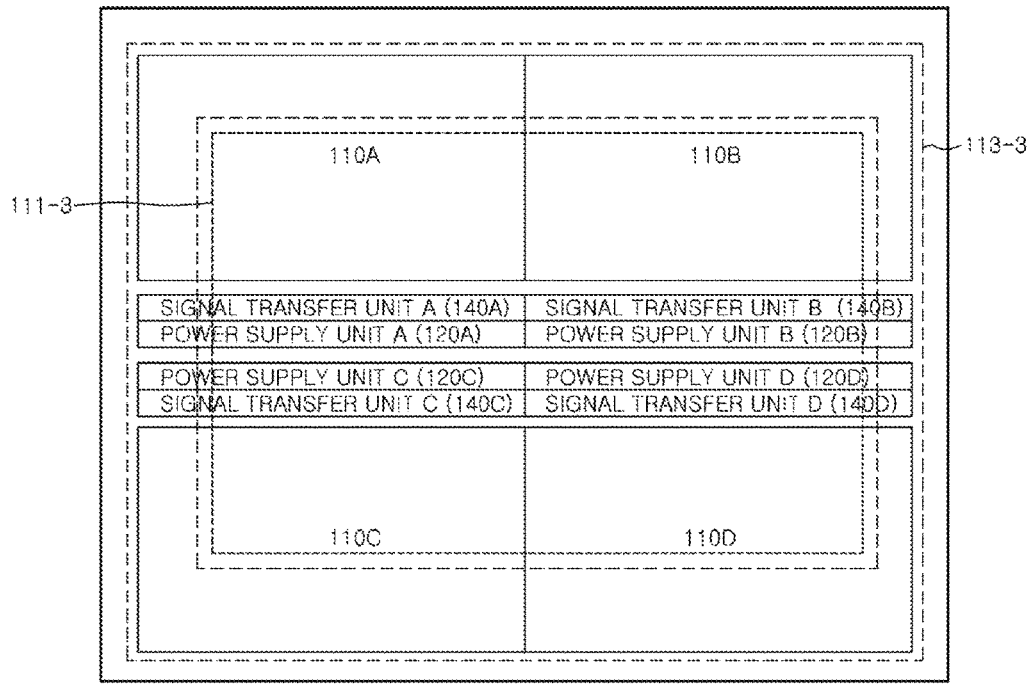

FIGS. 2 to 4 are schematic views illustrating configurations of memory regions according to an embodiment.

A memory region 110-1 illustrated in FIG. 2 may include a plurality of memory cell arrays, for example, first to fourth memory arrays 110A, 110B, 110C, and 110D and a peripheral region 115.

In an embodiment, at least one of the first to fourth memory cell arrays 110A, 110B, 110C, and 110D may be an effective region 111-1 and the remaining memory cell arrays may be a residual region 113-1. In an embodiment, a portion of each of the first to fourth memory cell arrays 110A, 110B, 110C, and 110D may be each part of the effective region 111-1 and the remaining portion thereof may be a residual region 113-1.

Power supply units 120A, 120B, 120C, and 120D and signal transfer units 140A, 140B, 140C, and 140D may be included in the peripheral region 115.

FIG. 2 illustrates an example embodiment. Referring to FIG. 2, a first memory cell array 110A between the memory cell arrays 110A, 110B, 110C, and the 110D may be allocated to the residual region 113-1. However, the allocation of the residual region is not limited thereto.

Each of the power supply units 120A, 120B, 120C, and 120D may include a plurality of power supply circuits to provide the voltages required for operations of the memory cell arrays 110A, 110B, 110C, and 110D as data storage space (hereinafter referred to as "the required voltages"). The power supply units 120A, 120B, 120C, and 120D may be controlled to minimize the power supply for the residual region 113-1. For example, the power supply units 120A, 120B, 120C, and 120D may be controlled so that the required voltages are not supplied to the residual region 113-1. Each of the signal transfer units 140A, 140B, 140C, and 140D may include a plurality of signal transfer circuits to transfer signals required for the operations of the memory cell arrays 110A, 110B, 110C, and 110D as data storage space (hereinafter referred to as "the required signals"). The signal transfer units 140A, 140B, 140C, and 140D may be controlled so that the required signals are not provided to the residual region 113-1 or only a minimum number of signals are provided to the residual region 113-1.

Other examples of memory regions 110-2 and 110-3 including effective regions 111-2 and 111-3 and residual regions 113-2 and 113-3 are illustrated in FIGS. 3 and 4. Referring to FIG. 3, a memory region 110-2 may include first to fourth memory arrays 110A, 110B, 110C, and 110D. In an embodiment, the first memory array 110A and portions of the second to fourth arrays 1108, 110C, and 110D may be allocated to an effective region 111-2, and remaining portions of the second to fourth arrays 1108, 110C, and 110D may be allocated to the residual region 113-2. Referring to FIG. 4, a memory region 110-3 may include first to fourth memory arrays 110A, 110B, 110C, and 110D. In an embodiment, portions of the first to fourth arrays 110A, 110B, 110C, and 110D may be allocated to an effective region 111-3, and remaining portions of the first to fourth arrays 110A, 1106, 110C, and 110D may be allocated to the residual region 113-3.

In an embodiment, the memory regions 110, 110-1, 110-2, and 110-3, which have data capacities of powers of 2, may include the effective regions 111, 111-1, 111-2, and 111-3, which may be used as a data storage space, and the residual regions 113, 113-1, 113-2, and 113-3.

Figure 5:
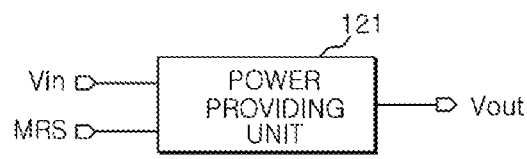
FIG. 5 is a schematic view illustrating a configuration of a power supply unit according to an embodiment.

FIG. 5 is a schematic view illustrating a configuration of a power supply unit according to an embodiment.

As described above, the required voltages may not be supplied to the residual regions 113, 113-1, 113-2, and 113-3 so that they are not used as data storage spaces. Also, the power supply to the residual regions 113, 113-1, 113-2, and 113-3 may be minimized so that they are used for the purposes other than a data storage space.

For example, the power supply unit 120 may supply the voltages required for the operations to the effective regions 111, 111-1, 111-2, and 111-3 while interrupting or reducing the power supply with respect to the residual regions 113, 113-1, 113-2, and 113-3.

Referring to FIG. 5, a power supply unit 120-1 in an embodiment may include a power providing unit 121 which provides an output voltage Vout in response to an input voltage Vin and a mode control signal MRS.

Figure 6:
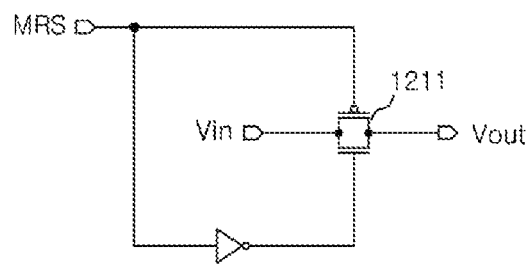
FIG. 6 is a schematic view illustrating a power providing unit illustrated in FIG. 5.

In an embodiment, the power providing unit 121 may be configured as illustrated in FIG. 6. The power providing unit 121 may include a switching circuit 1211. The switching circuit 1211 may receive an input voltage Vin, and output an output voltage Vout in response to a mode control signal MRS.

The mode control signal MRS may be provided from the controller 130. The mode control signal MRS may be set in such a manner that the output voltage Vout may be applied to a memory region allocated as the effective regions 111, 111-1, 111-2, and 111-3 but may not be applied to at least a portion of a memory region allocated as the residual region 113, 113-1, 113-2, and 113-3.

In an embodiment, the power supply unit 120 may maintain or interrupt the power supply with respect to the memory region. Whether or not the power supply unit 120 will supply the necessary voltages to the memory region may be determined through fuse programming as illustrated in FIGS. 7 and 8.

Figure 7:
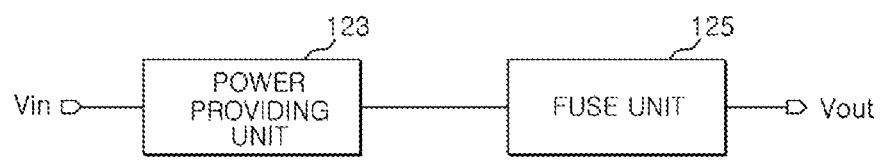
FIGS. 7 and 8 are schematic views illustrating configurations of power supply units according to an embodiment.

FIG. 7 illustrates a power supply unit 120-2 including a power providing unit 123 which receives an input voltage Vin and a fuse unit 125 which is coupled to an output terminal of the power providing unit 123 and generates an output voltage Vout. The power providing unit 123 may output a signal to the fuse unit 125 in response to the input voltage Vin, and the fuse unit 125 may generate the output voltage Vout in response to the signal outputted from the power providing unit 123.

Figure 8:
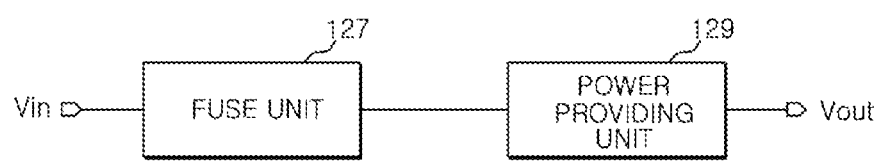

FIG. 8 illustrates a power supply unit 120-3 including a fuse unit 127 which receives an input voltage Vin and a power providing unit 129 which is coupled to an output terminal of the fuse unit 127 and generates an output voltage Vout. The fuse unit 127 may output a signal to the power providing unit 129 in response to the input voltage Vin, and the power providing unit 129 may generate the output voltage Vout in response to the signal outputted from the fuse unit 127.

The fuse units 125 and 127 may include such fuses as physically cuttable fuses or electrical fuses, but the type of the fuse for the fuse units 125 and 127 is not limited thereto.

As illustrated in FIGS. 5 to 8, the power supply units 120, 120-1, 120-2, and 120-3 may be configured in such a manner that required operation voltages may be provided to the effective regions 111, 111-1, 111-2, and 111-3, but may not be provided to at least portions of the residual regions 113, 113-1, 113-2 and 113-3.

Figure 9:
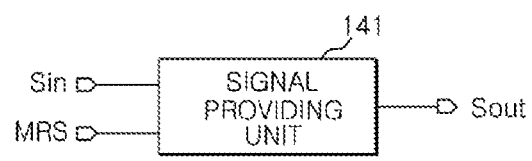
FIG. 9 is a schematic view illustrating a configuration of a signal transfer unit according to an embodiment.

FIG. 9 is a schematic view illustrating a configuration of a signal transfer unit according to an embodiment.

As described above, the required signals such as a command signal, and a clock signal may not be provided to the residual regions 113, 113-1, 113-2, and 113-3 or only a minimum number of signals between the required signals may be provided to the residual regions 113, 113-1, 113-2, and 113-3.

For example, the signal transfer unit 140 may provide the signals required for operations to the effective regions 111, 111-1, 111-2, and 111-3 but not to at least portions of the residual regions 113, 113-1, 113-2, and 113-3.

Referring to FIG. 9, a signal transfer unit 140-1 according to an embodiment may include a signal providing unit 141 which provides an output signal Sout in response to an input signal Sin and a mode control signal MRS.

Figure 10:
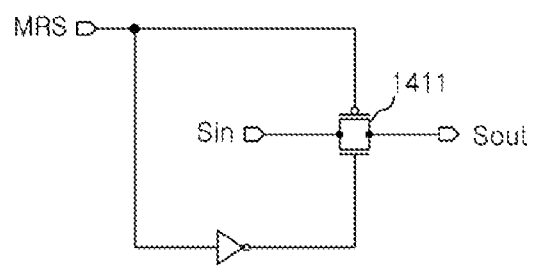
FIG. 10 is a schematic view illustrating a signal providing unit illustrated in FIG. 9.

In an embodiment, the signal providing unit 141 may be configured as illustrated in FIG. 10. The signal providing unit 141 may include a switching circuit 1411. The switching circuit 1411 may receive an input signal Sin, and output an output signal Sout in response to a mode control signal MRS.

The mode control signal MRS may be provided from the controller 130. The mode control signal MRS may be set in such a manner that the output signal Sout may be applied to a memory region allocated as the effective regions 111, 111-1, 111-2, and 111-3 but not to at least a portion of a memory region allocated as the residual regions 113, 113-1, 113-2, and 113-3.

In an embodiment, the signal transfer unit 140 may transfer or interrupt signals to the memory region. Whether the signal transfer unit 140 may transfer or interrupt signals may be determined through fuse programming as illustrated in FIGS. 11 and 12.

Figure 11:
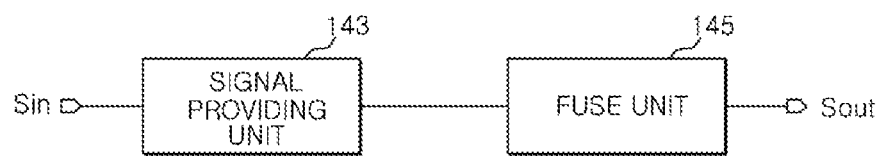
FIGS. 11 and 12 are schematic views illustrating configurations of signal transfer units according to an embodiment.

FIG. 11 illustrates a signal transfer unit 140-2 including a signal providing unit 143 which receives an input signal Sin and a fuse unit 145 which is coupled to an output terminal of the signal providing unit 143 and generates an output signal Sout. The signal providing unit 143 may output a signal to the fuse unit 145 in response to the input signal Sin, and the fuse unit 145 may generate the output signal Sout in response to the signal outputted from the signal providing unit 143.

Figure 12:
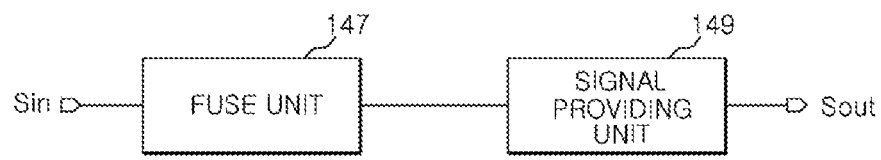

FIG. 12 illustrates a signal transfer unit 140-3 including a fuse unit 147 which receives an input signal Sin and a signal providing unit 149 which is coupled to an output terminal of the fuse unit 147 and generates an output signal Sout. The fuse unit 147 may output a signal to the signal providing unit 129 in response to the input signal Sin, and the signal providing unit 149 may generate the output signal Sout in response to the signal outputted from the fuse unit 147.

The fuse units 145 and 147 may include such fuses as physically cuttable fuses or electrical fuses, but the type of the fuse for the fuse units 145 and 147 is not limited thereto.

As illustrated in FIGS. 9 to 12, the signal transfer units 140, 140-1, 140-2, and 140-3 may be configured in such a manner that the required signals may be provided to the effective regions 111, 111-1, 111-2, and 111-3, but may not be provided to at least portions of the residual regions 113, 113-1, 113-2 and 113-3.

The residual regions 113, 113-1, 113-2, and 113-3 of the memory regions 110, 110-1, 110-2, and 110-3 may be left as an unused region. The residual regions 113, 113-1, 113-2, and 113-3 may be, in part or as a whole, converted to circuit parts for other purposes. In an embodiment, unlike the effective regions 111, 111-1, 111-2, and 111-3, the residual regions 113, 113-1, 113-2, and 113-3 are not provided with the voltages and signals which required for the residual regions to be used as data storage spaces, thereby reducing power consumption. As described above, by minimizing unnecessary voltages and signals with respect to the residual regions 113, 113-1, 113-2, and 113-3, the power consumption of the semiconductor memory apparatus 10 may be minimized or resource efficiency may be maximized.

The memory regions 110, 110-1, 110-2, and 110-3 may include a plurality of switching circuits or a plurality of driving circuits. The switching circuit may include an NMOS transistor or a PMOS transistor, and the driving circuit may include an inverter.

The switching circuits or the driving circuits may be included in the effective regions 111, 111-1, 111-2, and 111-3 and the residual regions 113, 113-1, 113-2, and 113-3. The residual regions 113, 113-1, 113-2, and 113-3 including the switching circuits or the driving circuits therein may reduce power consumption by controlling a bias applied to the switching circuit or the driving circuit.

By not supplying voltages, the residual regions 113, 113-1, 113-2, and 113-3 may be electrically isolated. By contrast, the method of controlling the bias of the switching circuit or the driving circuit may maintain the voltage being supplied from the power supply units 120, 120-1, 120-2, and 120-3. Instead, the residual regions 113, 113-1, 113-2, and 113-3 including the switching circuits or the driving circuits therein may reduce power consumption by controlling the bias being applied to the switching circuit or the driving circuit, thereby minimizing a latch-up.

Figure 13:
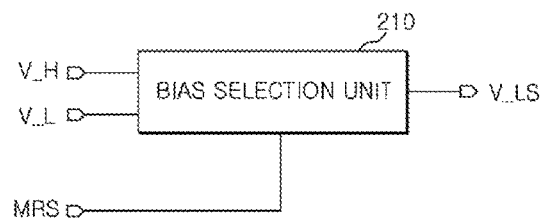
FIG. 13 is a schematic view illustrating a bias supply unit for a memory region according to an embodiment.

FIG. 13 is a schematic view illustrating a bias supply unit which may be provided in a memory region according to an embodiment.

Referring to FIG. 13, a bias supply unit 20 may include a bias selection unit 210 which receives a first bias V_H and a second bias V_L, selects any one of the first and second biases V_H and V_L in response to a mode control signal MRS, and outputs the selected bias as a level transition bias V_LS.

The first bias V_H may be a bias having a relatively high potential level, and the second bias V_L may be a bias having a lower potential level than the first bias V_H.

The level transition bias V_LS, output from the bias selection unit 210, may be provided to a switching circuit, for example, a gate terminal, a source terminal, or a bulk terminal of an NMOS transistor or a PMOS transistor.

For example, when the switching circuit is an NMOS transistor or a PMOS transistor, an operation of the switching circuit may be interrupted by lowering a bias of a source terminal and increasing a bias of a bulk terminal. The operation of an inverter, which is configured by coupling a PMOS transistor and an NMOS transistor in series, as a driving circuit may also be interrupted through the similar principle.

Figure 14:
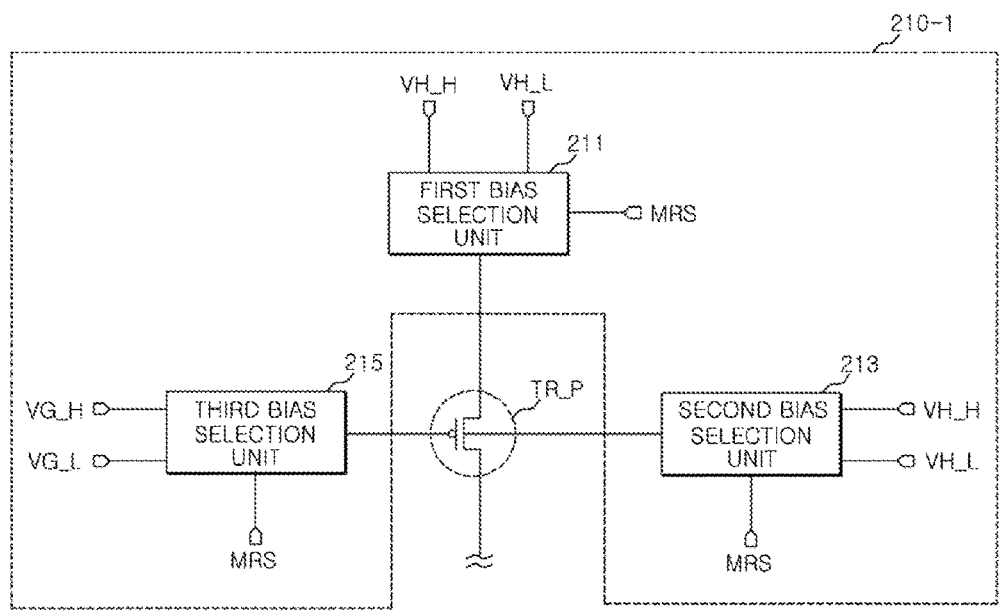
FIGS. 14 to 16 are schematic views illustrating circuits to which a bias supply unit is applied.
Figure 15:
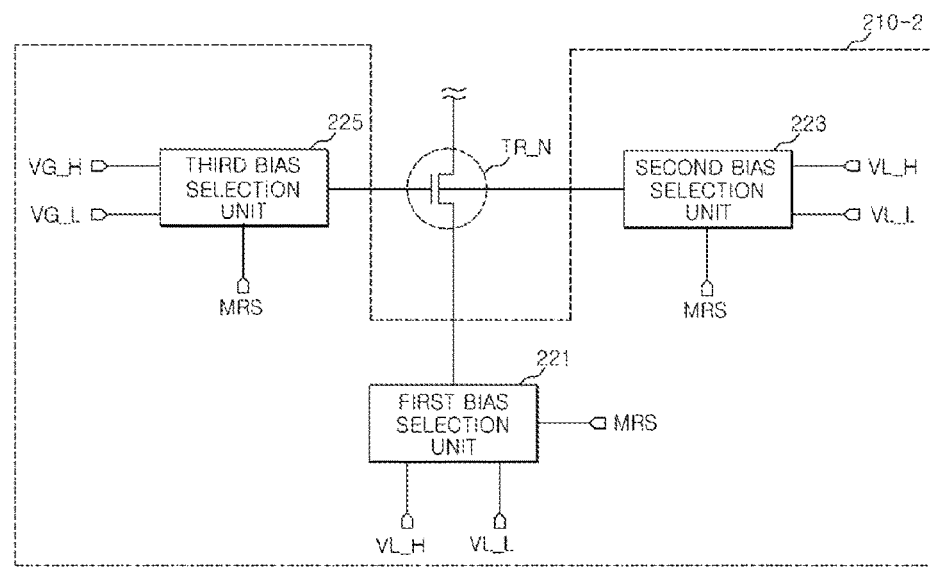
Figure 16:
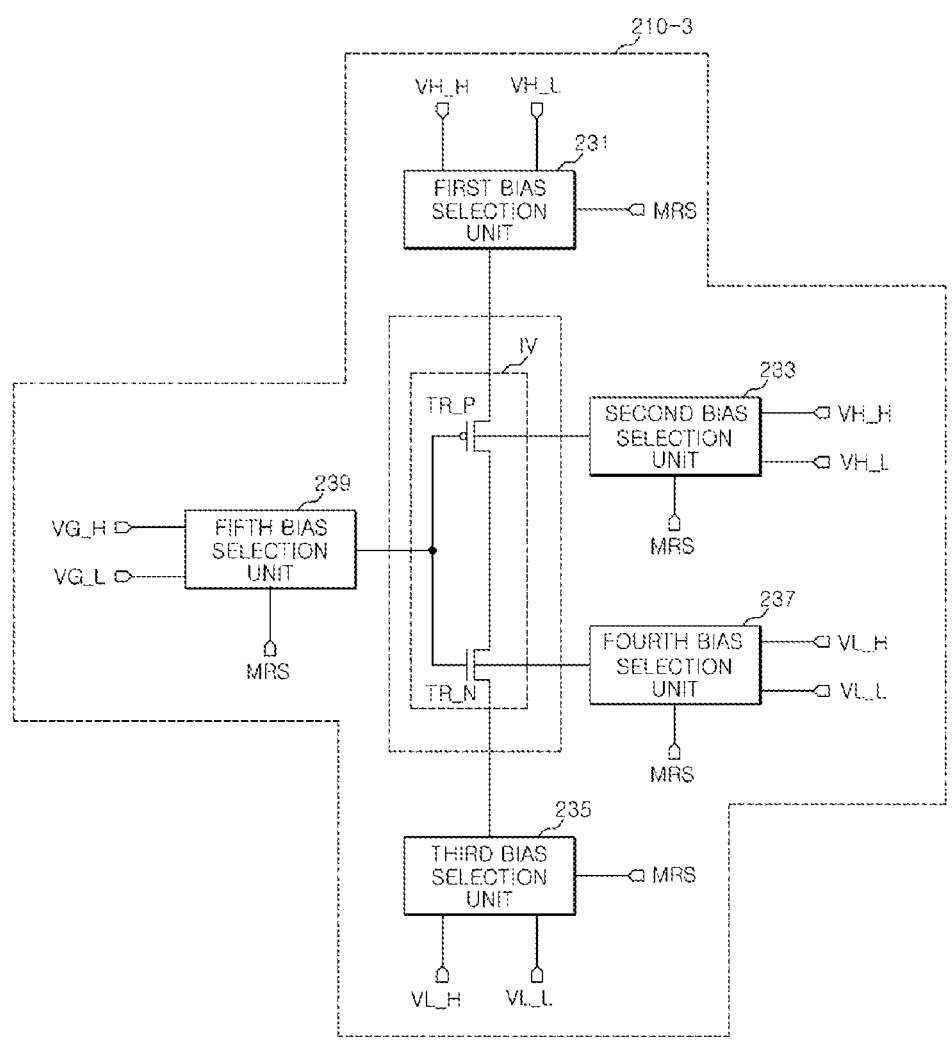

FIGS. 14 to 16 are schematic views illustrating circuits to which a bias supply unit is applied according to an embodiment.

FIG. 14 illustrates a PMOS transistor TR_P as an example of a switching circuit. A bias supply unit 210-1 may include a first bias selection unit 211 which controls a bias of a source terminal of the PMOS transistor TR_P, and a second bias selection unit 213 which controls a bias of a bulk terminal of the PMOS transistor TR_P. According to an example, the bias supply unit 210-1 may further include a third bias selection unit 215 which controls a bias of a gate terminal of the PMOS transistor TR_P.

The first bias selection unit 211 and the second bias selection unit 213 may receive a first bias VH_H of a first level and a second bias VH_L of a second level, select any one of the first and second biases VH_H and VH_L in response to a mode control signal MRS, and provide the selected bias to the source terminal or the bulk terminal of the PMOS transistor TR_P.

The mode control signal MRS may be set in such a manner that the first bias selection unit 211 selects the second bias VH_L of the second level which is a relatively low level, and the second bias selection unit 213 selects the first bias VH_H of the first level which is a relatively high level. The relatively low level of the second bias VH_L and the relatively high level of the first bias VH_H may be voltage levels turning off the PMOS transistor TR_P of the residual region 113, 113-1, 113-2, or 113-3.

The third bias selection unit 215 may receive a first gate bias VG_H and a second gate bias VG_L, select any one of the input gate biases VG_H and VG_L in response to the mode control signal MRS, and provide the selected gate bias to the gate terminal of the PMOS transistor TR_P.

FIG. 15 illustrates an NMOS transistor TR_N as an example of a switching circuit. A bias supply unit 210-2 may include a first bias selection unit 221 which controls a bias of a source terminal of the NMOS transistor TR_N, and a second bias selection unit 223 which controls a bias of a bulk terminal of the NMOS transistor TR_N. According to an example, the bias supply unit 210-2 may further include a third bias selection unit 225 which controls a bias of a gate terminal of the NMOS transistor TR_N.

The first bias selection unit 221 and the second bias selection unit 223 may receive a third bias VL_H of a third level and a fourth bias VL_L of a fourth level, select any one of the third and fourth biases VL_H and VL_L in response to a mode control signal MRS, and provide the selected bias to the source terminal or the bulk terminal of the NMOS transistor TR_N.

The mode control signal MRS may be set in such a manner that the first bias selection unit 221 selects the fourth bias VL_L of the fourth level which is a relatively low level, and the second bias selection unit 223 selects the third bias VL_H of the third level which is a relatively high level. The relatively low level of the fourth bias VL_L and the relatively high level of the third bias VL_H may be voltage levels turning off the NMOS transistor TR_N of the residual region 113, 113-1, 113-2, or 113-3.

The third bias selection unit 225 may receive a first gate bias VG_H and a second gate bias VG_L, select any one of the input gate biases VG_H and VG_L in response to the mode control signal MRS, and provide the selected gate bias to the gate terminal of the NMOS transistor TR_N.

FIG. 16 illustrates an inverter IV in which a PMOS transistor TR_P and an NMOS transistor TR_N are coupled in series as an example of a driving circuit. A bias supply unit 210-3 may include a first bias selection unit 231 which controls a bias of a source terminal of the PMOS transistor TR_P, a second bias selection unit 233 which controls a bias of a bulk terminal of the PMOS transistor TR_P, a third bias selection unit 235 which controls a bias of a source terminal of the NMOS transistor TR_N, and a fourth bias selection unit 237 which controls a bias of a bulk terminal of the NMOS transistor TR_N. According to an example, the bias supply unit 210-3 may further include a fifth bias selection unit 239 which controls a bias of a common gate terminal of the PMOS transistor TR_P and the NMOS transistor TR_N.

The first bias selection unit 231 and the second bias selection unit 233 may receive a first bias VH_H of a first level and a second bias VH_L of a second level, select any one of the first and second biases VH_H and VH_L in response to a mode control signal MRS, and provide the selected bias to the source terminal or the bulk terminal of the PMOS transistor.

The third bias selection unit 235 and the fourth bias selection unit 237 may receive a third bias VL_H of a third level and a fourth bias VL_L of a fourth level, select any one of the third and fourth biases VL_H and VL_L in response to the mode control signal MRS, and provide the selected bias to the source terminal or the bulk terminal of the NMOS transistor.

The mode control signal MRS may be set in such a manner that the first bias selection unit 231 selects the second bias VH_L of the second level which is a relatively low level, and the second bias selection unit 233 selects the first bias VH_H of the first level which is a relatively high level, in the PMOS transistor side. The relatively low level of the second bias VH_L and the relatively high level of the first bias VH_H may be voltage levels turning off the PMOS transistor TR_P of the residual region 113, 113-1, 113-2, or 113-3. Further, the mode control signal MRS may be set in such a manner that the third bias selection unit 235 selects the fourth bias VL_L of the fourth level which is a relatively low level, and the fourth bias selection unit 237 selects the third bias VL_H of the third level which is a relatively high level, in the NMOS transistor side. The relatively low level of the fourth bias VL_L and the relatively high level of the third bias VL_H may be voltage levels turning off the NMOS transistor TR_N of the residual region 113, 113-1, 113-2, or 113-3.

The fifth bias selection unit 239 may receive a first gate bias VG_H and a second gate bias VG_L, select any one of the input gate biases VG_H and VG_L in response to the mode control signal MRS, and provide the selected gate bias to the common gate terminal of the inverter IV.

The memory regions 110, 110-1, 110-2, and 110-3 may include a voltage generation circuit which receives an external voltage and generates internal voltages having various levels. The voltage generation circuit may be provided in the effective regions 111, 111-1, 111-2, and 111-3, and the residual regions 113, 113-1, 113-2, and 113-3. Therefore, the power consumption with respect to the residual regions 113, 113-1, 113-2, and 113-3 may be minimized by controlling biases being applied to devices constituting the voltage generation circuits of the residual regions 113, 113-1, 113-2, and 113-3.

Figure 17:
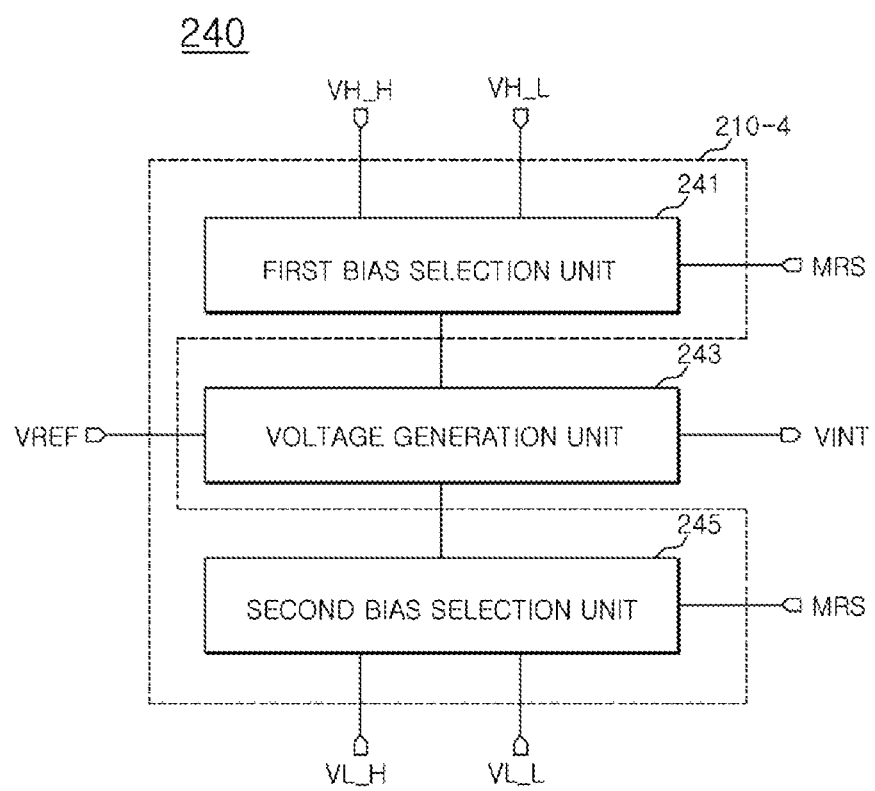
FIG. 17 is a schematic view illustrating a voltage generating circuit for a memory region according to an embodiment.

FIG. 17 is a schematic view illustrating a voltage generation circuit which may be provided in a memory region according to an embodiment.

Referring to FIG. 17, a voltage generating circuit 240 may include a voltage generating unit 243, which receives a reference voltage VREF and generates an internal voltage VINT, and a bias supply unit 210-4. Biases required for operations of devices constituting the voltage generating unit 243 may be controlled by a first bias selection unit 241 and a second bias selection unit 245.

For example, the first bias selection unit 241 may receive a first bias VH_H of a first level and a second bias VH_L of a second level, select any one of the input biases VH_H and VH_L in response to a mode control signal MRS, and output the selected bias.

For example, the second bias selection unit 245 may receive a third bias VL_H of a third level and a fourth bias VL_L of a fourth level, select any one of the input biases VL_H and VL_L in response to the mode control signal MRS, and output the selected bias.

The bias supply unit 210-4 may include the first bias selection unit 241 and the second bias selection unit 245.

The voltage generation circuit 240 illustrated in FIG. 17 will be described in detail with reference to FIG. 18.

The voltage generation unit 243 may compare a preset reference voltage VREF and a reference voltage VREF1 internally generated, and generate the internal voltage VINT. The configuration of the voltage generation unit 243 is not limited to the example illustrated in FIG. 18.

The first bias selection unit 241 may include a first source terminal bias selector 2411 and a first bulk terminal bias selector 2413. The first source terminal bias selector 2411 and the first bulk terminal bias selector 2413 may receive the first bias VH_H of the first level and the second bias VH_L of the second level, select any one of the input biases VH_H and VH_L in response to the mode control signal MRS, and provide the selected bias to a source terminal and a bulk terminal of a PMOS transistor in the voltage generating unit 243.

The second bias selection unit 245 may include a second source terminal bias selector 2451 and a second bulk terminal bias selector 2453. The second source terminal bias selector 2451 and the second bulk terminal bias selector 2453 may receive the third bias VL_H of the third level and the fourth bias VL_L of the fourth level, select any one of the input biases VL_H and VL_L in response to the mode control signal MRS, and provide the selected bias to a source terminal and a bulk terminal of an NMOS transistor in the voltage generating unit 243.

In an embodiment, the first bias selection unit 241 may be coupled to the PMOS transistor among the devices constituting the voltage generation unit 243. The mode control signal MRS may be set in such a manner that the first source terminal bias selector 2411 selects the second bias VH_L of the second level which is a relatively low level, and the first bulk terminal bias selector 2413 selects the first bias VH_H of the first level which is a relatively high level. The relatively low level of the second bias VH_L and the relatively high level of the first bias VH_H may be voltage levels turning off a PMOS of the voltage generation unit 243, which is coupled to the first source terminal bias selector 2411 and the first bulk terminal bias selector 2413.

Further, the second bias selection unit 245 may be coupled to the NMOS transistor among the devices constituting the voltage generation unit 243. The mode control signal MRS may be set in such a manner that the second source terminal bias selector 2451 selects the fourth bias VL_L of the fourth level which is a relatively low level, and the second bulk terminal bias selector 2453 selects the third bias VL_H of the third level which is a relatively high level. The relatively low level of the fourth bias VL_L and the relatively high level of the third bias VL_H may be voltage levels turning off the NMOS transistors of the voltage generation unit 243, which are coupled to the second source terminal bias selector 2451 and the second bulk terminal bias selector 2453.

Figure 18:
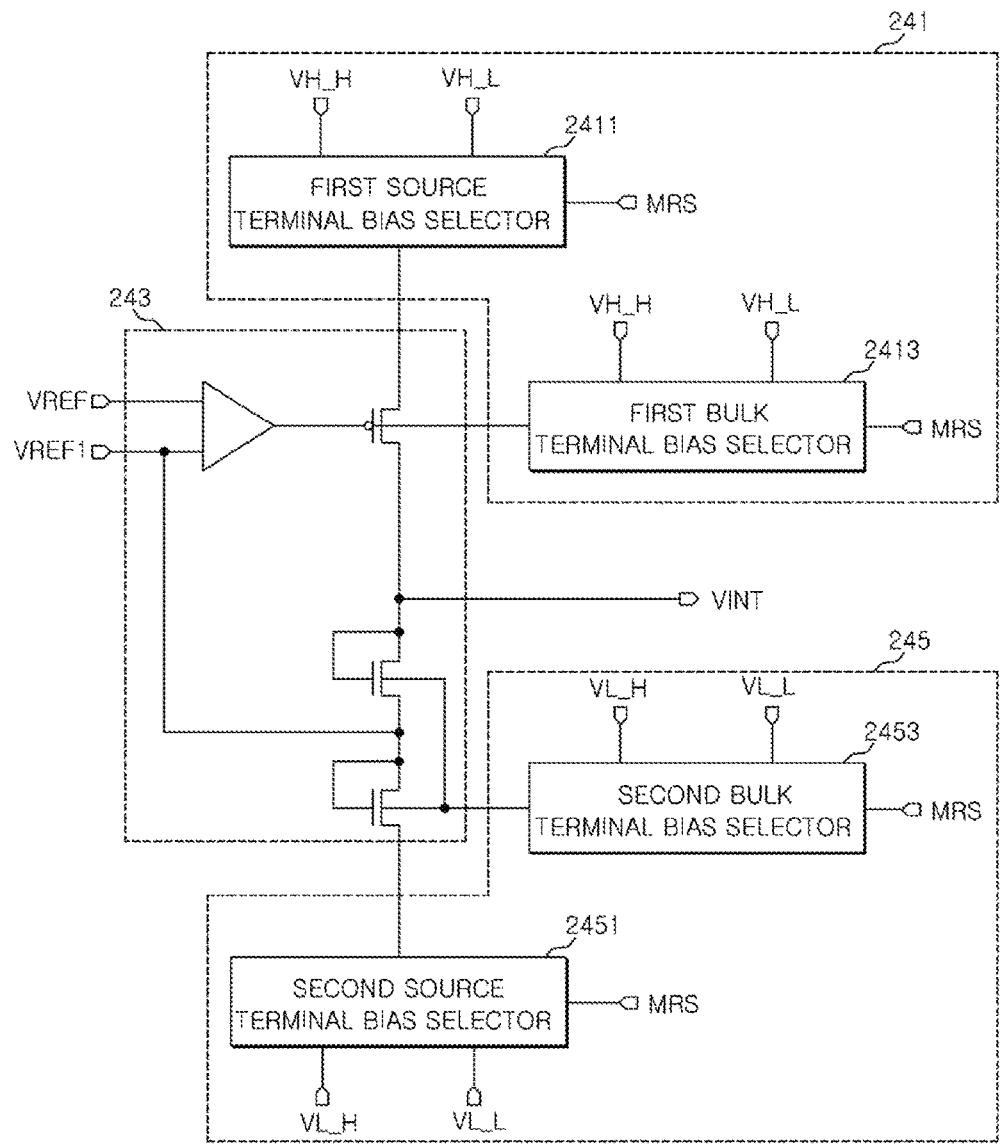
FIG. 18 is a schematic view illustrating the voltage generating circuit illustrated in FIG. 17.

The memory regions 110, 110-1, 110-2, and 110-3 of the semiconductor memory apparatus according to an embodiment may include one or more of the bias supply units 20, 210-1, 210-2, and 210-3 illustrated in FIGS. 13 to 16, and the bias supply unit 210-4 illustrated in FIGS. 17 and 18. The switching circuit or the driving circuit of the memory regions 110, 110-1, 110-2, and 110-3 may include one or more of the bias supply units 20, 210-1, 210-2, and 210-3 illustrated in FIGS. 13 to 16. In an embodiment, the voltage generation circuit of the memory regions 110, 110-1, 110-2, and 110-3 may include the bias supply unit 210-4 illustrated in FIGS. 17 and 18. In an embodiment, the switching circuit or the driving circuit of the memory regions 110, 110-1, 110-2, and 110-3 may include one or more of the bias supply units 20, 210-1, 210-2, and 210-3 illustrated in FIGS. 13 to 16, and the voltage generation circuit may include the bias supply unit 210-4 illustrated in FIGS. 17 and 18.

As described above, the residual regions 113, 113-1, 113-2, and 113-3 may be used as at least one of an ECC region, a reservoir capacitor region, and a redundancy region.

To use the residual regions 113, 113-1, 113-2, and 113-3 as the ECC region and/or the redundancy region, signal exchange between the residual regions 113, 113-1, 113-2, and 113-3 serving as the ECC region and/or the redundancy region and the effective region 111, 111-1, 111-2, and 111-3 is necessary and will be described with reference to FIGS. 19 to 21.

Figure 19:
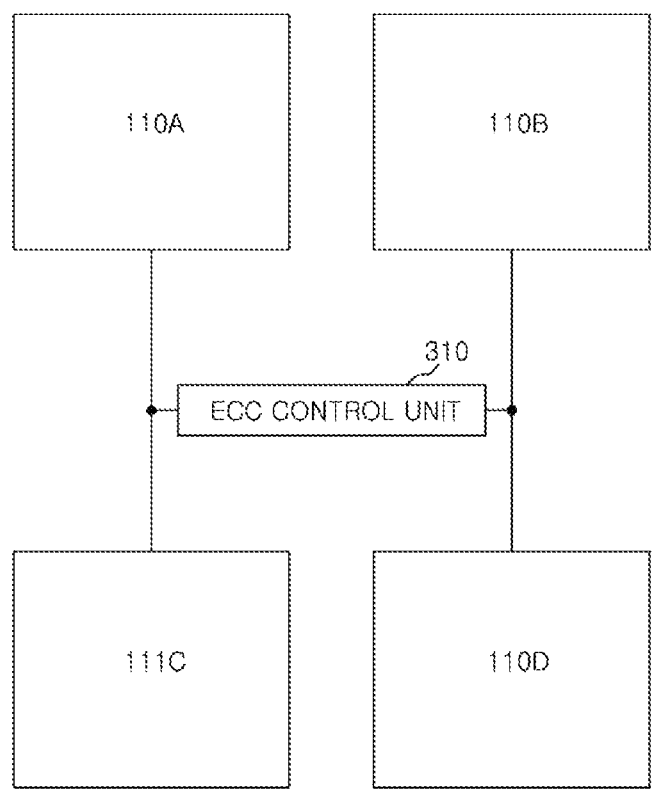
FIGS. 19 to 21 are schematic views illustrating examples of control circuits of a semiconductor memory apparatus according to an embodiment.
Figure 20:
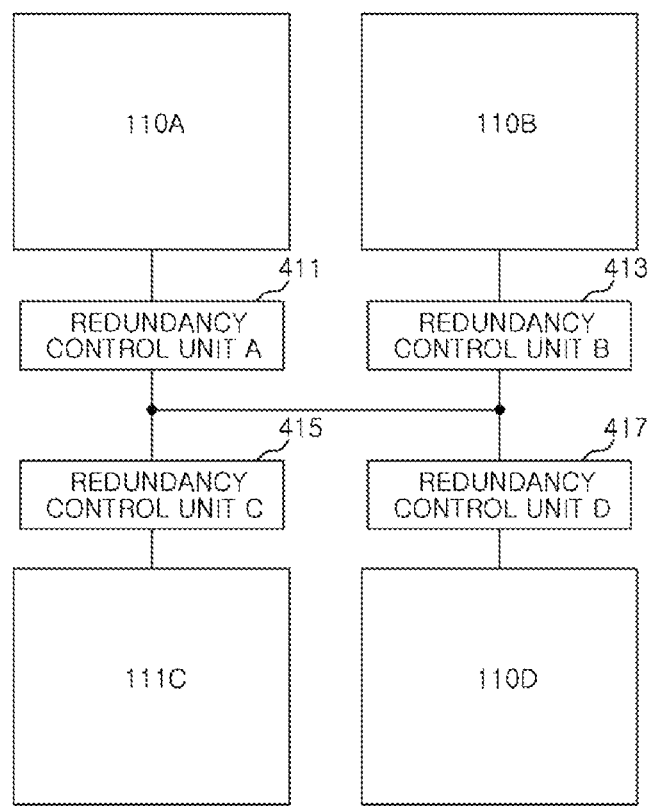
Figure 21:
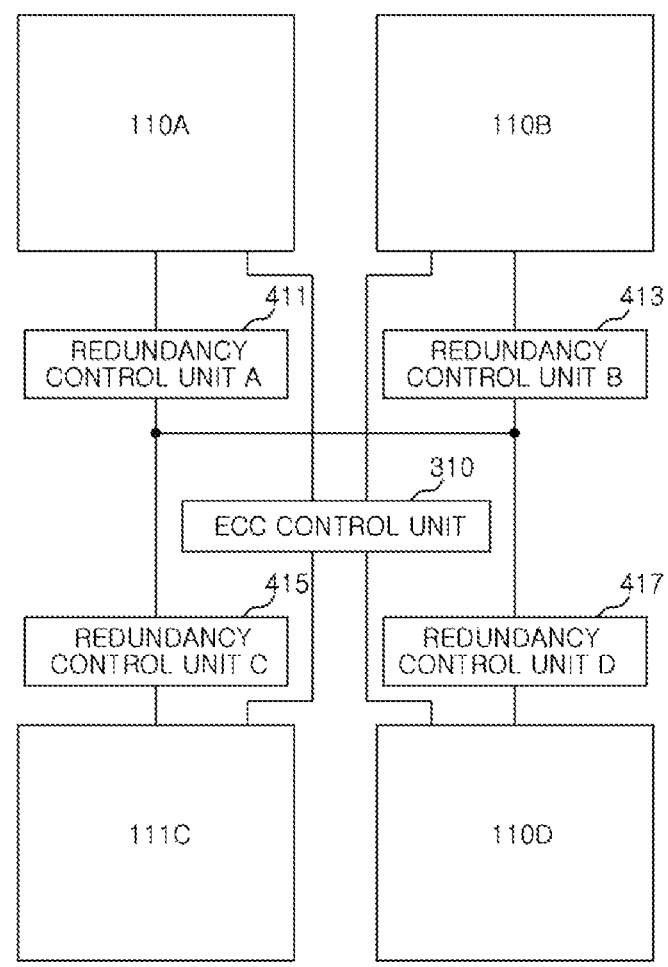

For clarity, it is assumed that memory regions illustrated in FIGS. 19 to 21 may be any one of the memory regions 110-1, 110-2, and 110-3 illustrated in FIGS. 2 to 4. Therefore, descriptions of FIGS. 19 to 21 will be made with reference to FIGS. 2 to 4 again.

FIG. 19 illustrates a memory region when a residual region is used as an ECC region. The memory region 110-1, 110-2, or 110-3 may include a plurality of memory cell arrays 110A, 110B, 110C, and 110D and an ECC control unit 310 which is electrically coupled to the memory cell arrays 110A, 110B, 110C, and 110D and is arranged in a peripheral region 115.

Although the effective regions 111-1, 111-2, and 111-3 and the residual regions 113-1, 113-2, and 113-3 are not divided and displayed in FIG. 19, the memory region including the plurality of memory cell arrays 110A, 110B, 110C, and 110D may include the effective region 111-1, 111-2, or 111-3 and the residual region 113-1, 113-2, or 113-3 divided in the forms illustrated in FIGS. 2 to 4.

The residual region 113-1, 113-2, or 113-3 of the memory region 110-1, 110-2, or 110-3 may serve as an ECC region, and data for error correction among operations of the semiconductor memory apparatus may be stored in the ECC region. The ECC control unit 310 is electrically coupled to the effective region 111-1, 111-2, or 111-3 and the residual region 113-1, 113-2, or 113-3 for the error correction operation.

FIG. 20 illustrates a memory region when a residual region is used as a redundancy region. The memory region 110-1, 110-2, or 110-3 may include a plurality of memory cell arrays 110A, 110B, 110C, and 110D and redundancy control units 411, 413, 415, and 417 which are electrically coupled to the memory cell arrays 110A, 110B, 110C, and 110D and are arranged in a peripheral region 115.

Errors may occur in memory cells constituting the effective region 111-1, 111-2, or 111-3 of the memory region 110-1, 110-2, or 110-3. The cell in which the error occurs may be replaced with a redundancy cell. In an embodiment, the residual region 113-1, 113-2, or 113-3 is used as the redundancy region, and a cell, in which an error occurs, among the memory cells of the effective region 111-1, 111-2, or 111-3 is replaced with a cell in the residual region 113-1, 113-2, or 113-3.

Access to the replaced cell is controlled through the redundancy control units 411, 413, 415, and 417 electrically coupled to the memory cell arrays 110A, 110B, 110C, and 110D.

FIG. 21 illustrates a memory region when the residual region 113-1, 113-2, or 113-3 is used as an ECC region and a redundancy region. The ECC control unit 310 and redundancy control units 411, 413, 415, and 417 may be included in a peripheral region 115.

The above embodiment is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory apparatus comprising:
an effective region configured to form a portion of an memory region and function as a data storage space;
a residual region configured to form another portion of the memory region; and
a capacity control circuit configured to be driven in response to a mode control signal provided from a controller, and to restrict supply of power and signals to the residual region,
wherein at least a portion of the residual region is configured to be changed from being an unused region to being at least one of an error correction code region and a reservoir capacitor region in response to the mode control signal.

2. The semiconductor memory apparatus of claim 1, wherein the capacity control circuit includes a power supply unit configured to supply power to the memory region, and the power supply unit is configured to restrict supply of power to the residual region.

3. The semiconductor memory apparatus of claim 2, wherein the power supply unit is driven in response to the mode control signal.

4. The semiconductor memory apparatus of claim 1, wherein the capacity control circuit includes a signal transfer unit configured to transfer the signal to the memory region, and the signal transfer unit interrupts signal being transferred to the residual region.

5. The semiconductor memory apparatus of claim 4, wherein the signal transfer unit is driven in response to the mode control signal.

6. The semiconductor memory apparatus of claim 1, wherein the memory region includes a plurality of switching circuits, and wherein the semiconductor memory apparatus further comprises a bias supply unit configured to control power being applied to a power terminal of each switching circuit in response to the mode control signal.

7. The semiconductor memory apparatus of claim 6, wherein the switching circuit is a transistor, and
wherein the bias supply unit includes:
a first bias selection unit coupled to a source terminal of the transistor, and configured to select any one of a first bias and a second bias in response to the mode control signal; and
a second bias selection unit coupled to a bulk terminal of the transistor and configured to select any one of the first bias and the second bias in response to the mode control signal.

8. The semiconductor memory apparatus of claim 7, wherein a level of the first bias is higher than that of the second bias.

9. The semiconductor memory apparatus of claim 1, further comprising:
a voltage generation circuit including a plurality of switching circuits and configured to receive an external voltage and generate an internal voltage; and
a bias supply unit configured to control power being applied to the voltage generation circuit in response to the mode control signal.

10. The semiconductor memory apparatus of claim 9, wherein each switching circuit is a transistor, and
wherein the bias supply unit includes:
a first bias selection unit coupled to a source terminal of the transistor and configured to select any one of a first bias and a second bias in response to the mode control signal; and
a second bias selection unit coupled to a bulk terminal of the transistor and configured to select any one of the first bias and the second bias in response to the mode control signal.

11. A semiconductor memory apparatus comprising:
an effective region configured to form a portion of an memory region and function as a data storage space;
a residual region configured to form another portion of the memory region; and
a bias supply unit configured to control voltages being applied to power terminals of a plurality of switching circuits formed in the residual region in response to the mode control signal,
wherein at least a portion of the residual region is configured to be changed from being an unused region to being at least one of an error correction code region and a reservoir capacitor region in response to the mode control signal.

12. The semiconductor memory apparatus of claim 11, wherein each switching circuit is a transistor, and
wherein the bias supply unit includes:
a first bias selection unit coupled to a source terminal of the transistor and configured to select any one of a first bias and a second bias in response to the mode control signal; and
a second bias selection unit coupled to a bulk terminal of the transistor and configured to select any one of the first bias and the second bias in response to the mode control signal.

13. The semiconductor memory apparatus of claim 12, wherein a level of the first bias is higher than that of the second bias.

14. The semiconductor memory apparatus of claim 11, further comprising:
a voltage generation circuit including the plurality of switching circuits and configured to receive an external voltage and generate an internal voltage; and
a bias supply unit configured to control power being applied to the voltage generation circuit in response to the mode control signal.

15. The semiconductor memory apparatus of claim 14, wherein each switching circuit is a transistor, and
wherein the bias supply unit includes:
a first bias selection unit coupled to a source terminal of the transistor and configured to select any one of a first bias and a second bias in response to the mode control signal; and
a second bias selection unit coupled to a bulk terminal of the transistor and configured to select any one of the first bias and the second bias in response to the mode control signal.

* * * * *